(12) United States Patent
Soejima et al.

(10) Patent No.: US 11,193,983 B2
(45) Date of Patent: Dec. 7, 2021

(54) METHOD OF ESTIMATING DETERIORATION STATE OF SECONDARY BATTERY AND SECONDARY BATTERY SYSTEM

(71) Applicant: TOYOTA JIDOSHA KABUSHIKI KAISHA, Toyota (JP)

(72) Inventors: Takanori Soejima, Toyota (JP); Hiroshi Hamaguchi, Toyota (JP); Ryo Kanada, Toyota (JP); Nobuyasu Haga, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 520 days.

(21) Appl. No.: 16/186,670

(22) Filed: Nov. 12, 2018

(65) Prior Publication Data
US 2019/0162796 A1 May 30, 2019

(30) Foreign Application Priority Data
Nov. 29, 2017 (JP) .............................. JP2017-229072

(51) Int. Cl.
| | |
|---|---|
| *G01R 31/392* | (2019.01) |
| *H01M 10/48* | (2006.01) |
| *G01R 31/3842* | (2019.01) |
| *G01R 31/389* | (2019.01) |
| *G01R 31/36* | (2020.01) |
| *B60L 58/16* | (2019.01) |

(Continued)

(52) U.S. Cl.
CPC ............ *G01R 31/392* (2019.01); *B60L 58/12* (2019.02); *B60L 58/16* (2019.02); *G01R 31/3648* (2013.01); *G01R 31/389* (2019.01); *G01R 31/3842* (2019.01); *H01M 10/48* (2013.01); *B60K 6/28* (2013.01); *B60L 2240/545* (2013.01); *B60L 2240/547* (2013.01); *B60L 2240/549* (2013.01)

(58) Field of Classification Search
None
See application file for complete search history.

(56) References Cited

U.S. PATENT DOCUMENTS

2008/0204031 A1* 8/2008 Iwane .................. G01R 31/389
324/430

FOREIGN PATENT DOCUMENTS

| JP | 2000-021455 A | 1/2000 |
|---|---|---|
| JP | 2005-221487 A | 8/2005 |

* cited by examiner

*Primary Examiner* — Jas A Sanghera
(74) *Attorney, Agent, or Firm* — Sughrue Mion, PLLC

(57) ABSTRACT

The first step includes performing FFT for a voltage and a current of a battery a plurality of times to thereby calculate the voltage and the current for each frequency. The second step includes determining whether or not the first condition and the second condition are satisfied for the current of the battery that is calculated for each frequency. The third step includes calculating an impedance component of the battery for each frequency range when at least one of the first condition and the second condition is not satisfied, and not calculating the impedance component of the battery for each frequency range when each of the first condition and the second condition is satisfied. The first condition shows that the current in a low frequency range is greater than a reference value. The second condition shows that the current in a frequency range is less than a reference value.

3 Claims, 15 Drawing Sheets

(51) Int. Cl.
*B60L 58/12* (2019.01)
*B60K 6/28* (2007.10)

FIG.15

| AVERAGE TEMPERATURE TB$_{ave}$ | ... | -10°C ~0°C | 0°C ~10°C | 10°C ~20°C | ... |
|---|---|---|---|---|---|
| PERMISSIBLE CURRENT VARIATION WIDTH ΔIB$_{max}$ | ... | 20A | 30A | 40A | ... |
| PERMISSIBLE TEMPERATURE VARIATION WIDTH ΔTB$_{max}$ | ... | 5°C | 10°C | 15°C | ... |
| PERMISSIBLE SOC VARIATION WIDTH ΔSOC$_{max}$ | ... | 4% | 6% | 8% | ... |

MP1

METHOD OF ESTIMATING DETERIORATION STATE OF SECONDARY BATTERY AND SECONDARY BATTERY SYSTEM This nonprovisional application is based on Japanese Patent Application No. 2017-229072 filed on Nov. 29, 2017 with the Japan Patent Office, the entire contents of which are hereby incorporated by reference.

BACKGROUND

Field

The present disclosure relates to a method of estimating a deterioration state of a secondary battery and a secondary battery system, and more particularly to a method of estimating a deterioration state of a secondary battery mounted in a vehicle, and a secondary battery system used while being mounted in the vehicle.

Description of the Background Art

In recent years, vehicles incorporating a secondary battery for traveling are becoming widespread. The secondary batteries mounted in these vehicles may deteriorate according to the method or environment of usage or may deteriorate over time. Accordingly, the deterioration state of the secondary battery needs to be estimated with high accuracy. Thus, there is a proposal of a method of estimating the deterioration state of the secondary battery based on the impedance (internal resistance) of the secondary battery.

For example, according to a method disclosed in Japanese Patent Laying-Open No. 2005-221487, a current value and a voltage value are measured in the state where charging and discharging currents having various waveforms with no periodicity flow through a secondary battery. Then, by performing Fourier transform of the measured current and voltage values, the impedance component for each frequency is calculated from the current and voltage values that have been subjected to Fourier transform.

SUMMARY

The present inventors have noted the following feature. Specifically, when the current value measured as described above is subjected to Fourier transform to acquire a current value for each frequency, if a prescribed condition (described later) for the current value in a certain frequency range is satisfied, the accuracy in calculating the current value for each frequency may decrease. When the accuracy in calculating the current value for each frequency decreases, highly accurate calculation of the impedance may not be able to be done. As a result, the accuracy in estimating the deterioration state of the secondary battery may decrease.

The present disclosure has been made to solve the above-described problems. An object of the present disclosure is to improve the accuracy in estimating the deterioration state of a secondary battery by a deterioration state estimating method for estimating the deterioration state of a secondary battery mounted in a vehicle.

Furthermore, another object of the present disclosure is to improve the accuracy in estimating the deterioration state of a secondary battery in a secondary battery system configured to be mounted in a vehicle.

(1) A method of estimating a deterioration state of a secondary battery according to an aspect of the present disclosure is performed by a controller for a secondary battery mounted in a vehicle. The method of estimating a deterioration state of a secondary battery includes the first step to the fifth step. The first step includes acquiring a voltage value and a current value of the secondary battery a plurality of times in a prescribed time period, and storing a plurality of voltage values and a plurality of current values in a memory. The second step includes performing frequency conversion of each of the plurality of voltage values and each of the plurality of current values of the secondary battery that are stored in the memory to calculate a voltage value and a current value of the secondary battery for each frequency. The third step includes determining whether or not a first condition and a second condition are satisfied for the current value of the secondary battery that is calculated for each frequency. The fourth step includes calculating an impedance component of the secondary battery for each frequency range when at least one of the first condition and the second condition is not satisfied, and not calculating the impedance component of the secondary battery for each frequency range when each of the first condition and the second condition is satisfied. The fifth step includes estimating a deterioration state of the secondary battery in a deterioration mode according to each frequency range by using the impedance component calculated for each frequency range. The first condition is a condition that a current value of the secondary battery in a first frequency range is greater than a first reference value. The second condition is a condition that a current value of the secondary battery in a second frequency range higher than the first frequency range is less than a second reference value. The second reference value is less than the first reference value.

Although described later in detail, when the first condition and the second condition are satisfied, the current variation in a relatively high frequency range (frequency ranges F2 and F3, which will be described later) is more likely to increase. Thus, according to the method described in the above (1), the data (the voltage value and the current value) obtained when the first and second current conditions are satisfied is not used for calculating the impedance component for each frequency range, but the data obtained when at least one of the first and second current conditions is not satisfied is used to calculate the impedance component for each frequency range. In this way, by calculating the impedance component without using the data obtained (i) when the first and the second conditions are satisfied and (ii) when the current variation in a relatively high frequency range is more likely to increase, the accuracy in estimating the deterioration state of the secondary battery can be improved.

(2) The method of estimating a deterioration state of a secondary battery further includes the sixth step and the seventh step. The sixth step includes calculating a current variation width of the secondary battery, a temperature variation width of the secondary battery, and a state of charge (SOC) variation width of the secondary battery in the prescribed time period. The seventh step includes acquiring, based on one of a temperature, a current and an SOC of the secondary battery, a permissible current variation width showing a permissible upper limit of the current variation width, a permissible temperature variation width showing a permissible upper limit of the temperature variation width, and a permissible SOC variation width showing a permissible upper limit of the SOC variation width. The permissible current variation width, the permissible temperature variation width and the permissible SOC variation width are set for one of the temperature, the current and the SOC of the secondary battery in the prescribed time period. The calculating an impedance component of the secondary battery for each frequency range (the fourth step) is performed upon satisfaction of each of: (i) a current condition that the current variation width is less than the permissible current variation width; (ii) a temperature condition that the temperature variation width is less than the permissible temperature variation width; and (iii) an SOC condition that the SOC variation width is less than the permissible SOC variation width.

According to the method described in the above (2), in view of the fact that the impedance of the secondary battery has current dependency, temperature dependency and SOC dependency, when the current, the temperature or the SOC of the secondary battery significantly changes in a prescribed time period (a data acquisition time period, which will be described later), the data (voltage and current) acquired in the usage time period is not subjected to frequency conversion (Fourier transform), and not used for calculating an impedance. The impedance is calculated when each of the current, the temperature and the SOC of the secondary battery does not significantly change in a prescribed time period. Thereby, the current dependency, the temperature dependency and the SOC dependency can be appropriately reflected in the result of calculating the impedance of the secondary battery. Accordingly, the accuracy in estimating the deterioration state of the secondary battery can be further improved.

(3) A secondary battery system according to another aspect of the present disclosure is used while being mounted in a vehicle. The secondary battery system includes: a secondary battery; and a controller configured to estimate a deterioration state of the secondary battery. The controller includes a memory. The controller is configured to perform frequency conversion of a voltage value and a current value of the secondary battery that are acquired a plurality of times in a prescribed time period, to calculate a voltage value and a current value of the secondary battery for each frequency; and determine whether or not a first condition and a second condition are satisfied for the current value of the secondary battery that is calculated for each frequency. The controller is configured to calculate an impedance component of the secondary battery for each frequency range when at least one of the first condition and the second condition is not satisfied, and estimate a deterioration state of the secondary battery in a deterioration mode according to each frequency range by using the impedance component for each frequency range. On the other hand, the controller does not calculate the impedance component of the secondary battery for each frequency range when each of the first condition and the second condition is satisfied. The first condition is a condition that a current value of the secondary battery in a first frequency range is greater than a first reference value. The second condition is a condition that a current value of the secondary battery in a second frequency range higher than the first frequency range is less than a second reference value. The second reference value is less than the first reference value.

According to the configuration described in the above (3), the accuracy in estimating the deterioration state of the secondary battery can be improved as in the method described in the above (1).

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 15 is a diagram showing an example of a map MP.

DESCRIPTION OF THE PREFERRED EMBODIMENTS

Figure 1:
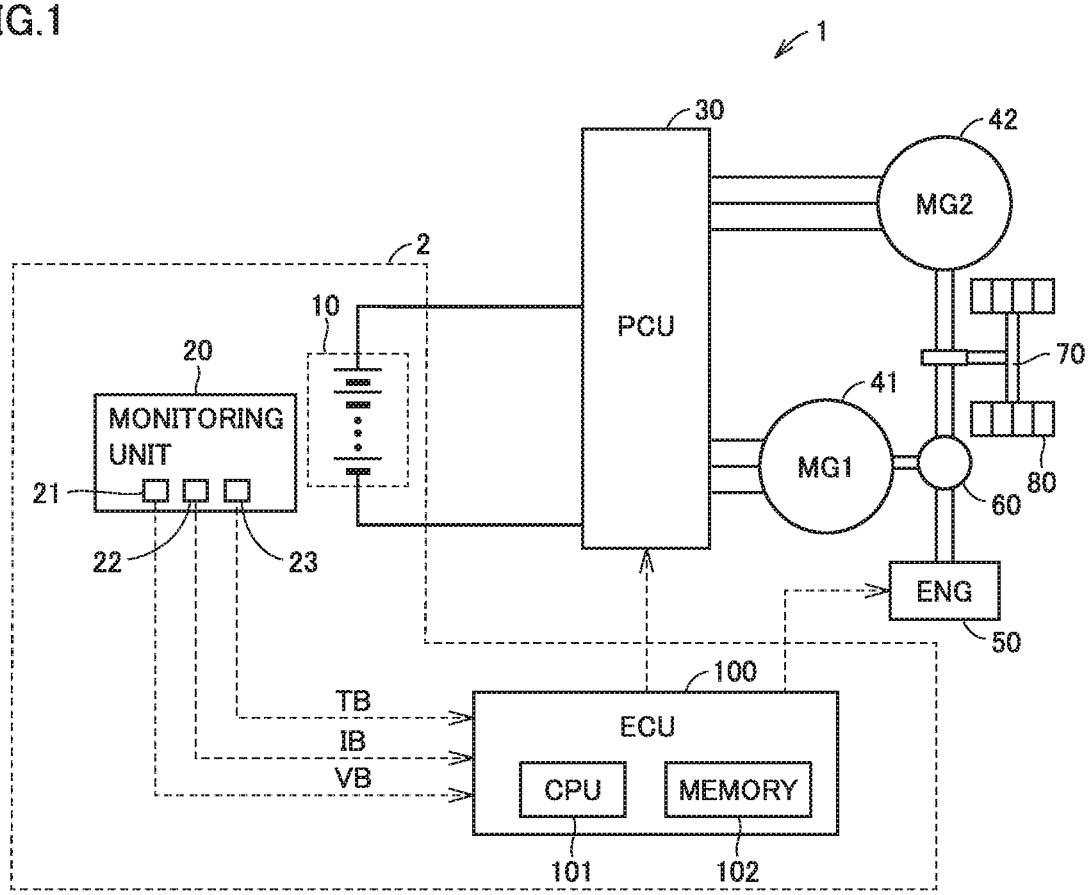
FIG. 1 is a diagram schematically showing the entire configuration of a vehicle equipped with a secondary battery system, according to the first embodiment.

Embodiments of the present disclosure will be hereinafter described in detail with reference to the accompanying drawings, in which the same or corresponding components are designated by the same reference characters, and the description thereof will not be repeated.

First Embodiment

<Configuration of Secondary Battery System>

FIG. 1 is a diagram schematically showing the entire configuration of a vehicle equipped with a secondary battery system, according to the first embodiment. Referring to FIG. 1, a vehicle 1 is a hybrid vehicle. However, the vehicle in which a battery system according to the present disclosure can be mounted is not limited to a hybrid vehicle (including a plug-in hybrid vehicle). The battery system according to the present disclosure can be mounted in vehicles in general, each of which is configured to generate driving force using the electric power supplied from a secondary battery system. Thus, vehicle 1 may be an electric vehicle or a fuel cell vehicle.

Vehicle 1 includes a secondary battery system 2, a power control unit (PCU) 30, motor generators 41 and 42, an engine 50, a power split device 60, a drive shaft 70, and driving wheels 80. Secondary battery system 2 includes a battery 10, a monitoring unit 20, and an electronic control unit (ECU) 100.

Engine 50 serves as an internal combustion engine configured to output motive power obtained by converting the combustion energy produced upon combustion of fuel-air mixture of air and fuel into kinetic energy for a motion element such as a piston and a rotor.

Power split device 60 includes a planetary gear mechanism (not shown) having three rotation shafts including a sun gear, a carrier and a ring gear, for example. Power split device 60 divides the motive power output from engine 50 into motive power for driving motor generator 41 and motive power for driving the driving wheels 80.

Motor generators 41 and 42 each are an alternating-current (AC) rotating electric machine, and, for example, a three-phase AC synchronous motor having a rotor in which a permanent magnet (not shown) is incorporated. Motor generator 41 is mainly used as a power generator driven by engine 50 via power split device 60. The electric power generated by motor generator 41 is supplied to motor generator 42 or battery 10 through PCU 30.

Motor generator 42 mainly operates as an electric motor to drive driving wheels 80. Motor generator 42 is driven upon reception of at least one of the electric power from battery 10 and the electric power generated by motor generator 41. Then, the driving force of motor generator 42 is transmitted to drive shaft 70. On the other hand, when the vehicle's brake is applied or when acceleration is slowed down while the vehicle is traveling downhill, motor generator 42 operates as a power generator to perform regenerative power generation. The electric power generated by motor generator 42 is supplied to battery 10 through PCU 30.

Battery 10 is a battery set configured to include a plurality of cells. Each cell 12 serves as a secondary battery such as a lithium-ion secondary battery or a nickel-metal hydride battery, for example. Battery 10 stores the electric power for driving motor generators 41 and 42, and supplies the electric power to motor generators 41 and 42 through PCU 30. Furthermore, battery 10 is charged with the generated electric power supplied through PCU 30 at the time when electric power is generated by motor generators 41 and 42.

Monitoring unit 20 includes a voltage sensor 21, a current sensor 22, and a temperature sensor 23. Voltage sensor 21 is configured to detect a voltage VB of battery 10. Current sensor 22 is configured to detect a current IB that is input into and output from battery 10. Temperature sensor 23 is configured to detect a temperature TB of battery 10. Each of the sensors outputs a signal showing the detection result to ECU 100. The configurations of battery 10 and monitoring unit 20 will be described with reference to FIG. 2 in greater detail.

According to the control signal from ECU 100, PCU 30 performs bidirectional power conversion between battery 10 and each of motor generators 41 and 42. PCU 30 is configured to be capable of separately controlling the states of motor generators 41 and 42. For example, PCU 30 can bring motor generator 41 into a regenerative state (power generation state) and also bring motor generator 42 into a power running state. PCU 30 is configured, for example, to include: two inverters (not shown) provided so as to correspond to motor generators 41 and 42; and a converter (not shown) configured to raise the direct-current (DC) voltage supplied to each of the inverters to be equal to or greater than the output voltage from battery 10.

ECU 100 is configured to include: a central processing unit (CPU) 101; a memory (a read only memory (ROM) and a random access memory (RAM)) 102; and an input/output port (not shown) through which various signals are input and output. ECU 100 performs various processing for controlling vehicle 1 in the desired state based on the signal received from each sensor and the program and the map that are stored in memory 102.

More specifically, ECU 100 controls engine 50 and PCU 30 to thereby control charging/discharging of battery 10. Furthermore, ECU 100 estimates the state of charge (SOC) of battery 10. For estimating the SOC, known methods such as a current integration method and a method using an OCV-SOC curve can be used. Furthermore, ECU 100 calculates the impedance (internal resistance) of battery 10. The impedance of battery 10 can be calculated from the ratio of voltage VB and current IB (=VB/IB). Calculation of the impedance will be described later in detail.

Figure 2:
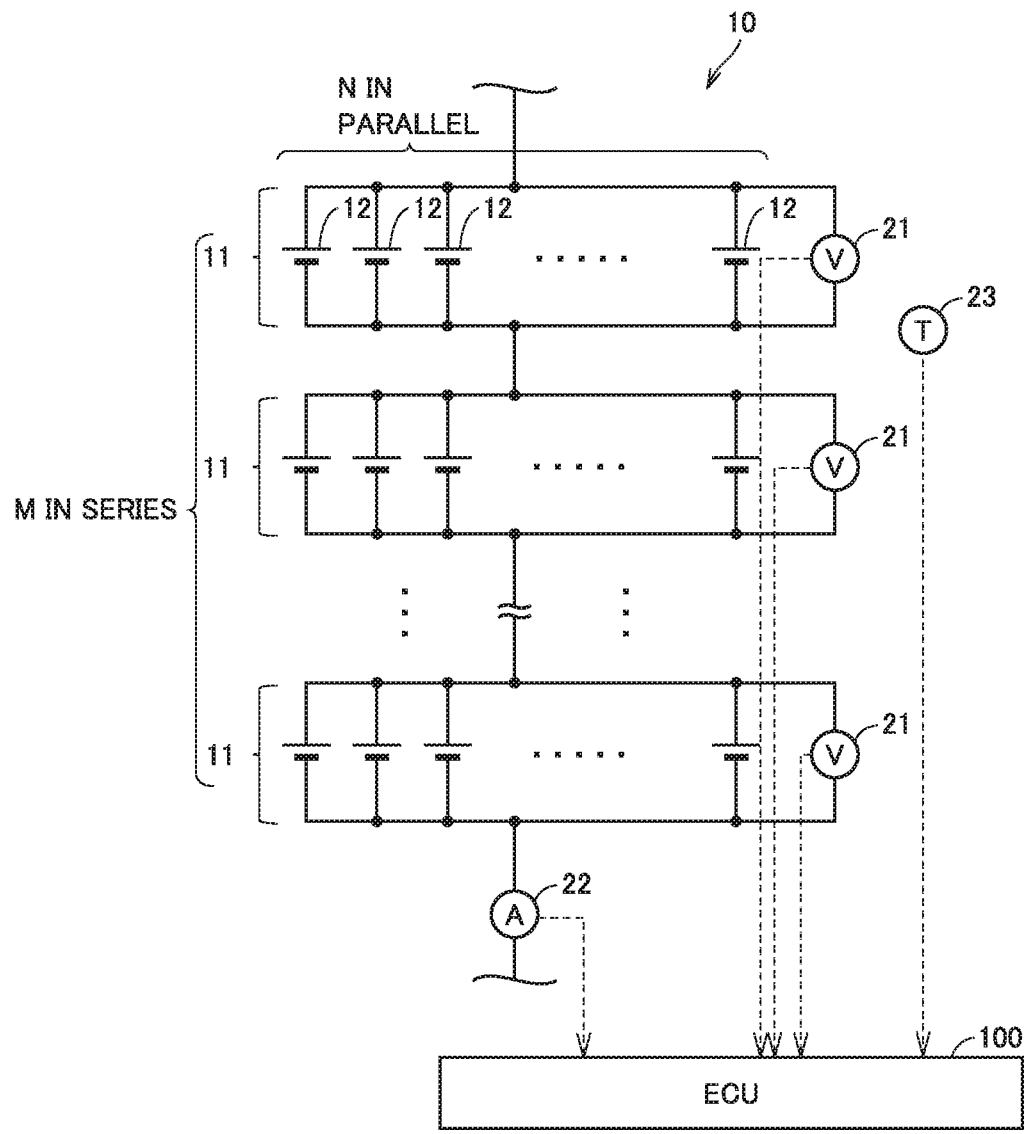
FIG. 2 is a diagram showing the configuration of a battery and a monitoring unit in greater detail.

FIG. 2 is a diagram showing the configuration of battery 10 and monitoring unit 20 in greater detail. Referring to FIGS. 1 and 2, battery 10 includes M blocks 11 that are connected in series. Each of blocks 11 includes N cells 12 that are connected in parallel. M and N each are a natural number of two or more.

Voltage sensor 21 detects the voltage on each of blocks 11. Current sensor 22 detects current IB flowing through all of blocks 11. Temperature sensor 23 detects the temperature of battery 10. It is to be noted that monitoring by the voltage sensor is not necessarily performed for each block, but may be performed for each cell 12, or may be performed for each of adjoining cells 12 (the number of which is less than the number of cells inside one block). Also, monitoring by temperature sensor 23 is not necessarily performed for each block or each cell. For example, the temperature may be detected for each block (or for each cell).

The internal configuration of battery 10 and the unit of the subject monitored by monitoring unit 20, as described above, are merely by way of example and not particularly limited. Accordingly, in the following description, a plurality of blocks 11 are not distinguished from each other and a plurality of cells 12 are not distinguished from each other, but these blocks 11 will be collectively simply referred to as battery 10 or these cells 12 will be collectively simply referred to as battery 10. Furthermore, monitoring unit 20 is described as monitoring voltage VB, current IB and temperature TB of battery 10.

<Current Variation during Traveling of Vehicle>

During traveling of vehicle 1 configured as described above, voltage VB, current IB, temperature TB and the SOC of battery 10 may change over time. It is to be noted that the term "during traveling" of vehicle 1 only has to indicate the state where the ignition is turned on to allow vehicle 1 to travel and may also include the state where vehicle 1 is temporarily stopped.

Figure 3:
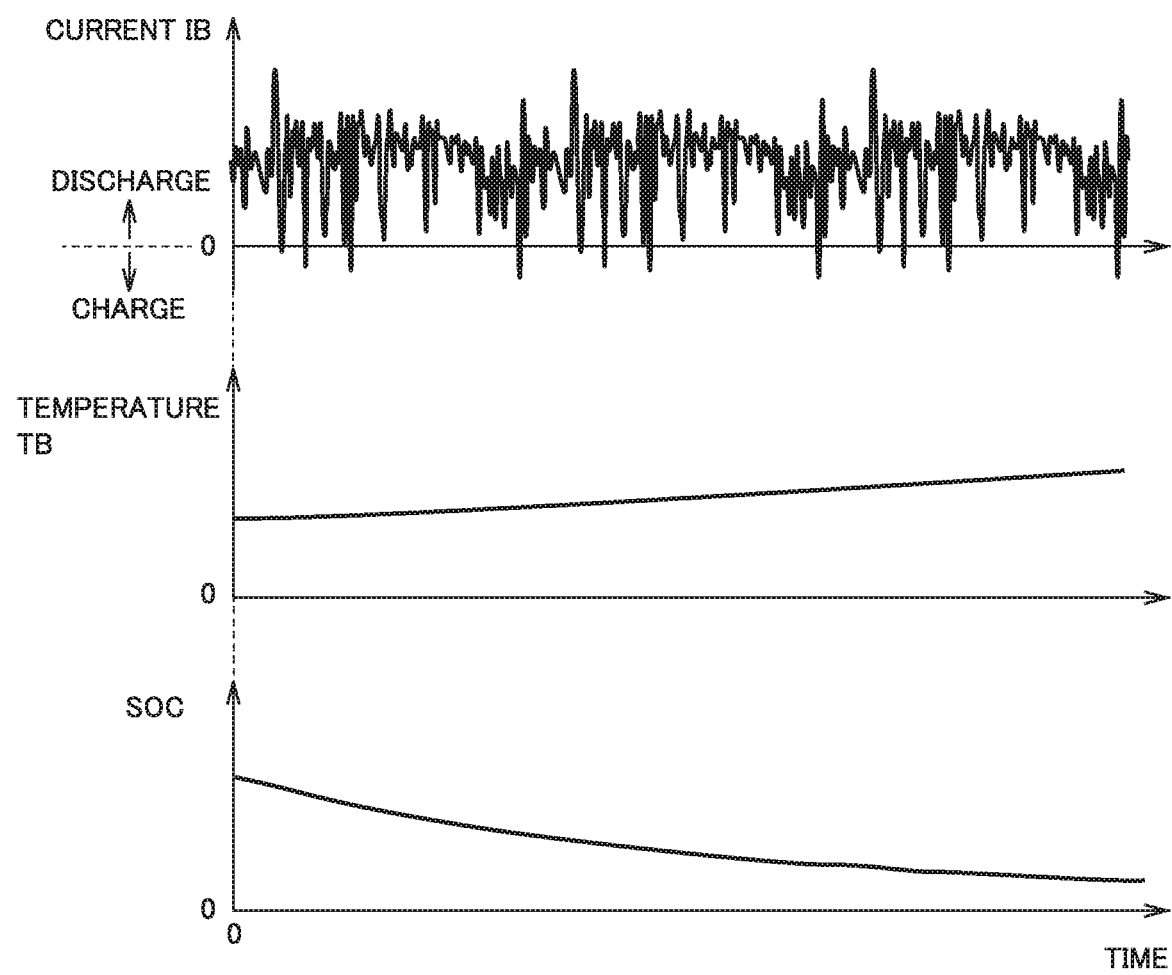
FIG. 3 is a diagram showing an example of temporal changes in the current, the temperature and the SOC of the battery during traveling of the vehicle.

FIG. 3 is a diagram showing an example of temporal changes in current IB, temperature TB and the SOC of battery 10 during traveling of vehicle 1. In FIG. 3 and FIG. 12 (described later), the horizontal axis shows an elapsed time period. The vertical axis shows current IB, temperature TB and the SOC in this order from the top. Although voltage VB may also irregularly change like current IB, voltage VB will not be shown for preventing complicated illustration.

Referring to FIG. 3, it takes some time that temperature TB and the SOC change. Also, temperature TB and the SOC may change relatively smoothly in many cases. In contrast, during traveling of vehicle 1, the discharging current from the battery changes as the driving force generated by motor generator 42 is adjusted, or the charging current flows through battery 10 in accordance with regenerative power generation of motor generator 42, with the result that current IB may irregularly change. When the impedance of battery 10 is calculated based on current IB that irregularly changes in this way, the frequency dependency of the impedance component is taken into consideration in the present embodiment, as will be described below.

<Calculation of Impedance>

Figure 4:
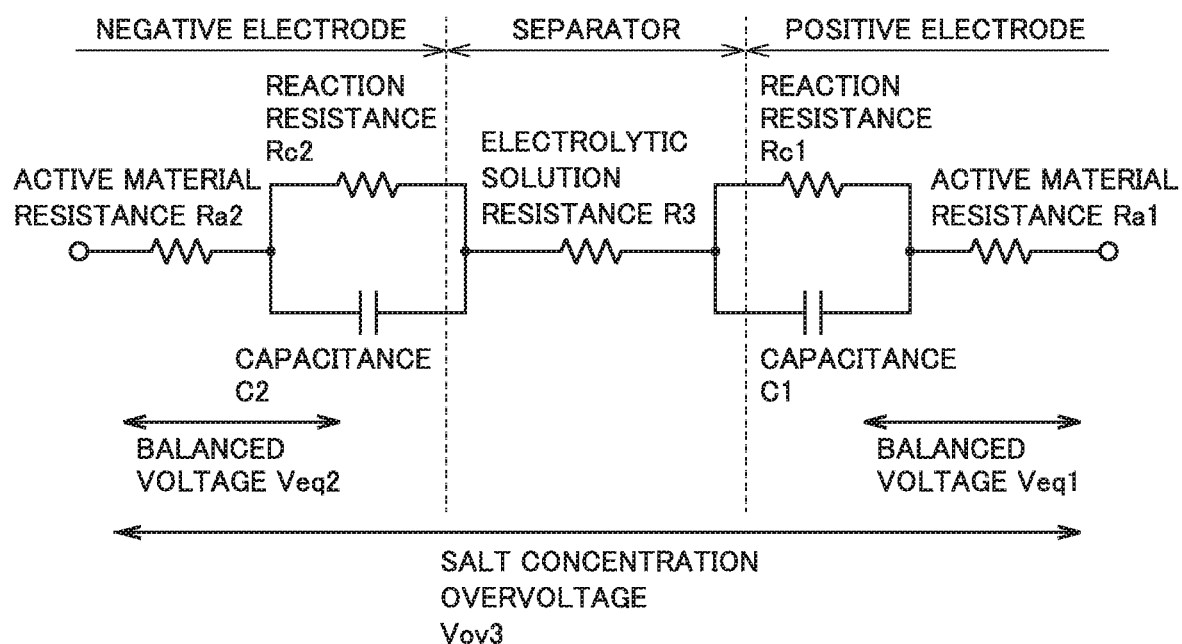
FIG. 4 is a diagram for illustrating an impedance component of the battery.

FIG. 4 is a diagram for illustrating the impedance component of battery 10. FIG. 4 shows an example of an equivalent circuit diagram of a positive electrode, a negative electrode, and a separator of battery 10 (more specifically, each cell 12). Generally, the impedance component of the secondary battery is roughly classified into a DC resistance $R_{DC}$, a reaction resistance $R_c$, and a diffusion resistance $R_d$.

DC resistance $R_{DC}$ shows an impedance component related to movements of ions and electrons between the positive electrode and the negative electrode. DC resistance $R_{DC}$ increases due to deviation of the salt concentration distribution and the like of the electrolytic solution at the time when a high load is applied to the secondary battery (when a high voltage is applied to the secondary battery or a high current flows through the secondary battery). In the equivalent circuit diagram shown in FIG. 4, DC resistance $R_{DC}$ is represented as an active material resistance Ra1 of the positive electrode, an active material resistance Ra2 of the negative electrode, and an electrolytic solution resistance R3 of the separator.

Reaction resistance $R_c$ is an impedance component related to movement of electric charges (charge transfer) at the interface between the electrolytic solution and the active material (the surfaces of the positive electrode active material and the negative electrode active material). Reaction resistance $R_c$ increases, for example, due to formation of a coating film on the interface between the active material and the electrolytic solution at the time when the secondary battery in a high SOC state exists in a high temperature environment. In the equivalent circuit diagram, reaction resistance $R_c$ is represented as a resistance component Rc1 of the positive electrode and a resistance component Rc2 of the negative electrode.

Diffusion resistance $R_d$ is an impedance component related to diffusion of charge transport materials in salt or the active material in an electrolytic solution. Diffusion resistance $R_d$ increases due to cracking or the like of the active material occurring when a high load is applied. Diffusion resistance $R_d$ is set based on a balanced voltage Veq1 generated in the positive electrode, a balanced voltage Veq2 generated in the negative electrode, and a salt concentration overvoltage Vov3 generated in a cell (an overvoltage resulting from occurrence of a salt concentration distribution of the active material in a separator).

As the impedance of battery 10 contains various impedance components as described above, the response time to the change of current IB is different for each impedance component. The impedance component with a relatively short response time can follow the change of voltage VB at a high frequency. On the other hand, the impedance component with a relatively long response time cannot follow the change of voltage VB at a high frequency. Accordingly, as will be described below, in each of the low frequency range, the medium frequency range and the high frequency range, there is an impedance component of battery 10 that is dominant in each of these frequency ranges.

Figure 5:
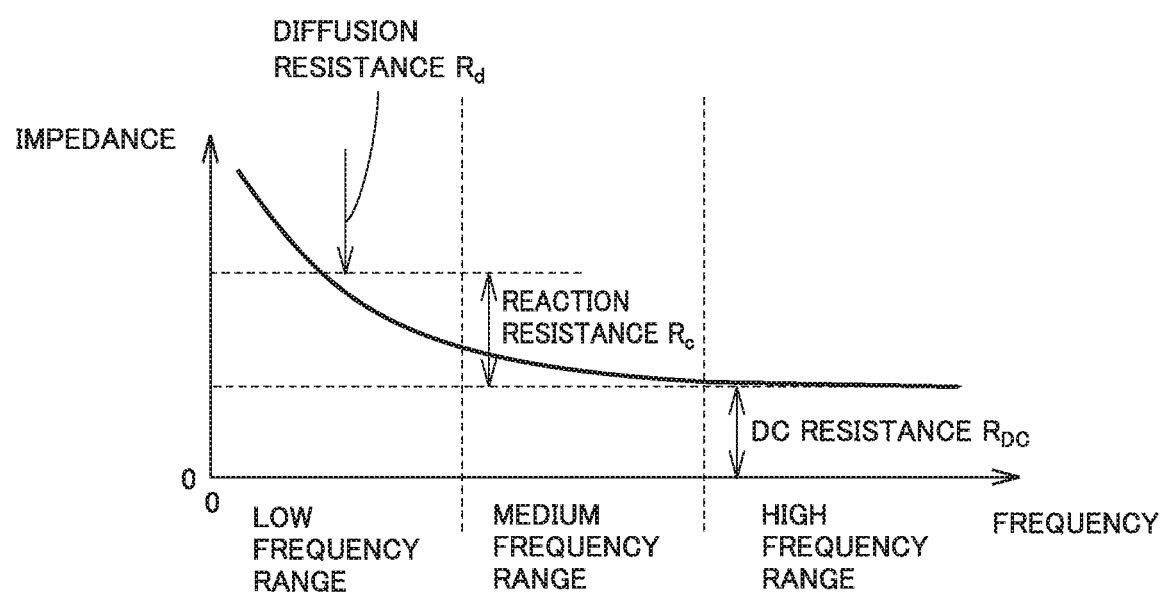
FIG. 5 is a diagram for illustrating the frequency dependency of the impedance component of the battery.

FIG. 5 is a diagram for illustrating the frequency dependency of the impedance component of battery 10. In FIG. 5, the horizontal axis shows the frequency of current IB (or voltage VB) while the vertical axis shows the impedance of battery 10.

In the following description, the impedance measured in the case where the frequency of current IB is included in the high frequency range is referred to as a "high frequency impedance component". The impedance measured in the case where the frequency of current IB is included in the medium frequency range is referred to as a "medium frequency impedance component". The impedance measured in the case where the frequency of current IB is included in the low frequency range is referred to as a "low frequency impedance component".

As shown in FIG. 5, DC resistance $R_{DC}$ of battery 10 is mainly reflected in the high frequency impedance component. Reaction resistance $R_c$ and DC resistance $R_{DC}$ of battery 10 are mainly reflected in the medium frequency impedance component. Thus, reaction resistance $R_c$ can be calculated from the difference between the medium frequency impedance component and the high frequency impedance component. Reaction resistance $R_c$, DC resistance $R_{DC}$ and diffusion resistance $R_d$ of battery 10 each are reflected in the low frequency impedance component. Thus, diffusion resistance $R_d$ can be calculated from the difference between the low frequency impedance component and the medium frequency impedance component.

In this way, by calculating the impedance component for each frequency range, DC resistance $R_{DC}$, reaction resistance $R_c$ and diffusion resistance $R_d$ can be separated from one another. Then, these resistances are associated with the different factors of deteriorations (deterioration modes) of battery 10. Accordingly, by determining how much the resistance (one of DC resistance $R_{DC}$, reaction resistance $R_c$ and diffusion resistance $R_d$) at the present time is increased from the resistance in the initial state of battery 10, the factor of deterioration of battery 10 can be estimated or the deterioration progress for each factor can be estimated. In other words, the deterioration state of battery 10 can be estimated with high accuracy.

<Fourier Transform>

In the present embodiment, Fourier transform is used for calculating the impedance component for each frequency range as described above.

Figure 6:
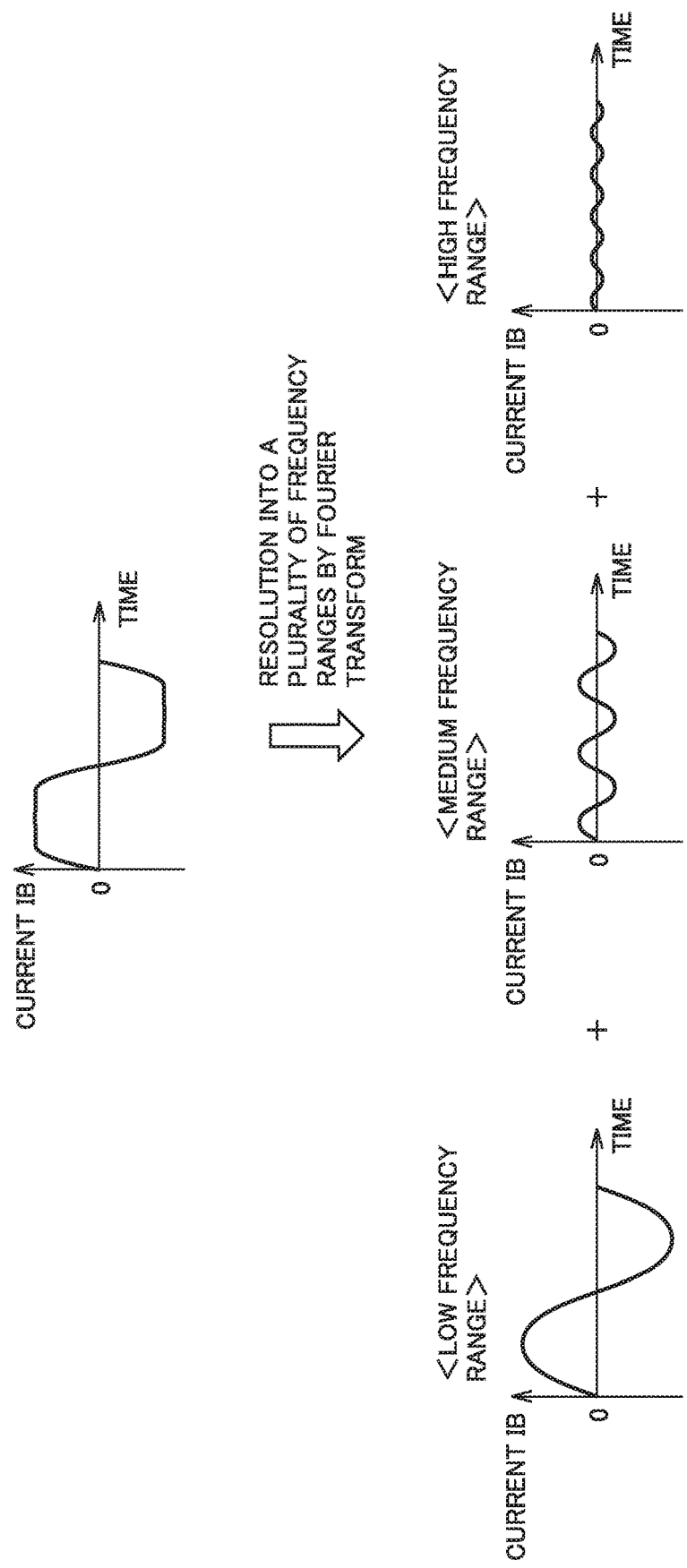
FIG. 6 is a conceptual diagram for illustrating a method of calculating the impedance component for each frequency range by Fourier transform.

FIG. 6 is a conceptual diagram for illustrating a method of calculating the impedance component for each frequency range by Fourier transform. As shown in FIG. 6, by subjecting current IB (and voltage VB) to Fourier transform, current IB can be decomposed into a low frequency component, a medium frequency component and a high frequency component. Based on voltage VB and current IB that are decomposed in this way, the impedance component can be calculated for each frequency range.

The following is an explanation about an example in which voltage VB and current IB are subjected to fast Fourier transform (FFT) to thereby calculate the impedance component. It is to be noted that the algorithm of Fourier transform is not limited to FFT but may be discrete Fourier transform (DFT).

Figure 7:
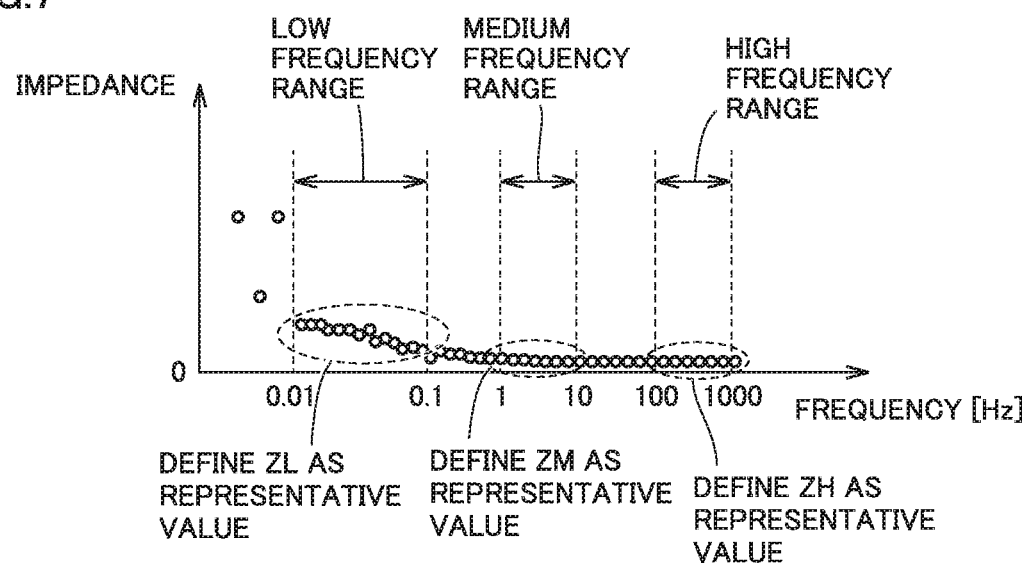
FIG. 7 is a diagram showing an example of the result of calculating the impedance component.

FIG. 7 is a diagram showing an example of the result of calculating the impedance component. In FIG. 7, the horizontal axis shows a frequency on the logarithmic scale. The low frequency range corresponds to a frequency range equal to or greater than 0.001 Hz and less than 0.1 Hz, for example. The medium frequency range corresponds to a frequency range equal to or greater than 1 Hz and less than 10 Hz, for example. The high frequency range corresponds to a frequency range equal to or greater than 100 Hz and less than 1 kHz, for example. The vertical axis in FIG. 7 shows an impedance.

As shown in FIG. 7, in each of the frequency ranges, a large number of impedance components with different frequencies are calculated. Thus, ECU 100 determines a representative value from such a large number of impedance components for each of the low frequency range, the medium frequency range and the high frequency range.

For example, when the maximum value of the impedance component is defined as a representative value, ECU 100 determines the maximum value of the impedance component in the low frequency range as a low frequency impedance component ZL. Also, ECU 100 determines the maximum value of the impedance component in the medium frequency range as a medium frequency impedance component ZM, and determines the maximum value of the impedance component in the high frequency range as a high frequency impedance component ZH. Defining the maximum value as a representative value is merely by way of example, but a representative value may be the average value or the median of the impedance components in each of the frequency ranges.

<Selection of Data>

In order to ensure the accuracy of the FFT, the data (voltage VB and current IB) repeatedly acquired for each sampling period needs to be accumulated in memory 102 of ECU 100 for a certain time period and then subjected to FFT. The time period for which data is accumulated in this way is also referred to as a "data acquisition time period". It is to be noted that the data acquisition time period corresponds to the "prescribed time period" according to the present disclosure.

The present inventors have noted the following feature. Specifically, when the current values accumulated in the data acquisition time period are subjected to FFT to acquire a current value in each frequency, if the condition about the current value in a certain frequency range is satisfied, the accuracy in calculating the current value (Fourier transform accuracy) may decrease. This condition corresponds to the first and second current conditions described later (corresponding to the "first and second conditions" according to the present disclosure).

Figure 8:
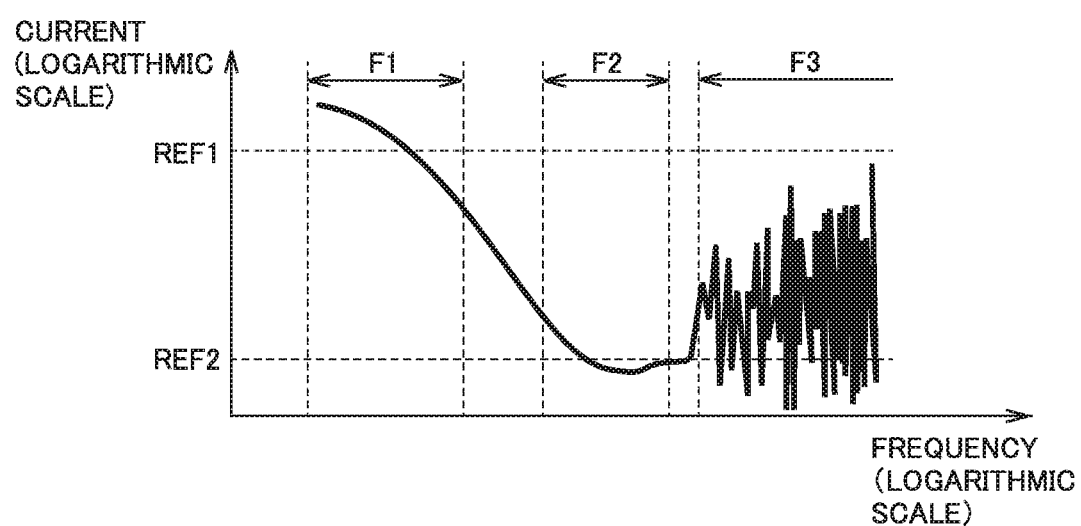
FIG. 8 is a diagram showing an example of a current component after Fourier transform in the case where the first and second current conditions are satisfied.
Figure 9:
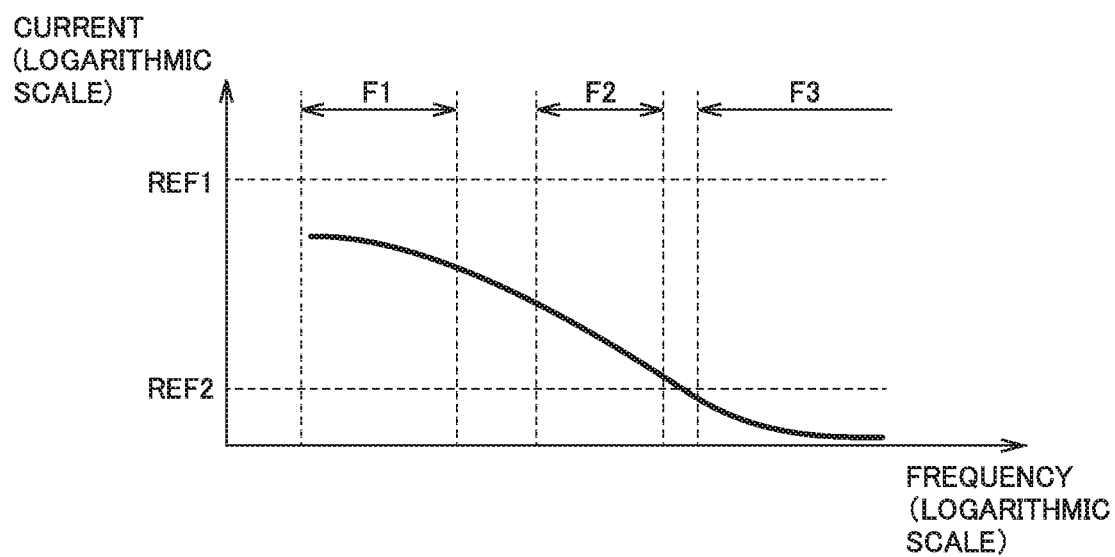
FIG. 9 is a diagram showing an example of the current component after Fourier transform in the case where the first and second current conditions are not satisfied.

FIG. 8 is a diagram showing an example of a current component after FFT in the case where the first and second current conditions are satisfied. FIG. 9 is a diagram showing an example of the current component after FFT in the case where the first and second current conditions are not satisfied. In FIGS. 8 and 9, the horizontal axis shows the frequency of the current on the logarithmic scale while the vertical axis shows the magnitude of the current on the logarithmic scale.

Referring to FIG. 8, when the frequency is divided into frequency ranges F1 to F3, the first current condition is a condition that the current component in a frequency range F1 (the first frequency range) corresponding to the lowest frequency is greater than a reference value REF1 (the first reference value). Specifically, when frequency range F1 includes a current component greater than reference value REF1, it can be recognized that the first current condition is satisfied.

The second current condition is a condition that the current component in an intermediate frequency range F2 (the second frequency range) is less than a reference value REF2 (the second reference value). When frequency range F2 includes a current component less than reference value REF2, it can be recognized that the second current condition is satisfied.

In this way, when the first and second current conditions are satisfied, that is, when the current component in frequency range F1 is dominant over the current components in frequency ranges F2 and F3 (in other words, when the current component in frequency range F1 is significantly greater than each of the current components in frequency ranges F2 and F3), the current variations in frequency ranges F2 and F3 are more likely to increase as shown in FIG. 8. On the other hand, in FIG. 9 in which the first and second current conditions are not satisfied, it turns out that the current variations in frequency ranges F2 and F3 (particularly F3 in FIG. 9) are smaller than those in FIG. 8.

FIG. 9 shows an example in the case where both the first and second current conditions are not satisfied, but the present inventors have confirmed that the current variation in the medium frequency range or the high frequency range is relatively small even when one of the first and second current conditions is satisfied.

The following is an explanation about the reason why the current variations in frequency ranges F2 and F3 increase due to satisfaction of the first and second current conditions. Generally, in Fourier transform, it is assumed that the signal to be converted is periodic. When the signal waveform that is not periodic is analyzed by Fourier transform, the analysis result is obtained on the premise that the signal waveform of similar shape repeatedly appears also beyond the data acquisition time period.

FIG. 10 is a diagram showing an example of the signal to be subjected to Fourier transform. In FIG. 10, the horizontal axis shows an elapsed time period while the vertical axis shows the signal strength (for example, the magnitude of the current).

Figure 10A:
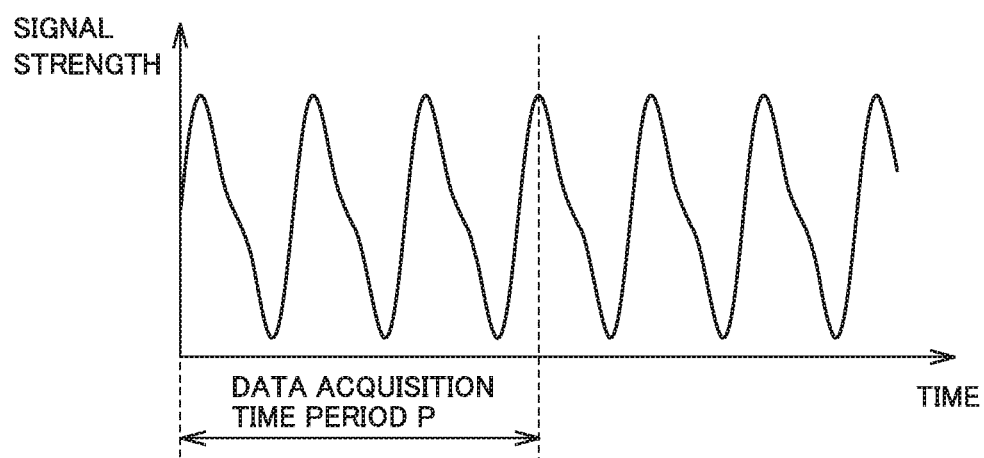
FIG. 10A is a diagram (the first diagram) showing an example of a signal to be subjected to Fourier transform.
Figure 10B:
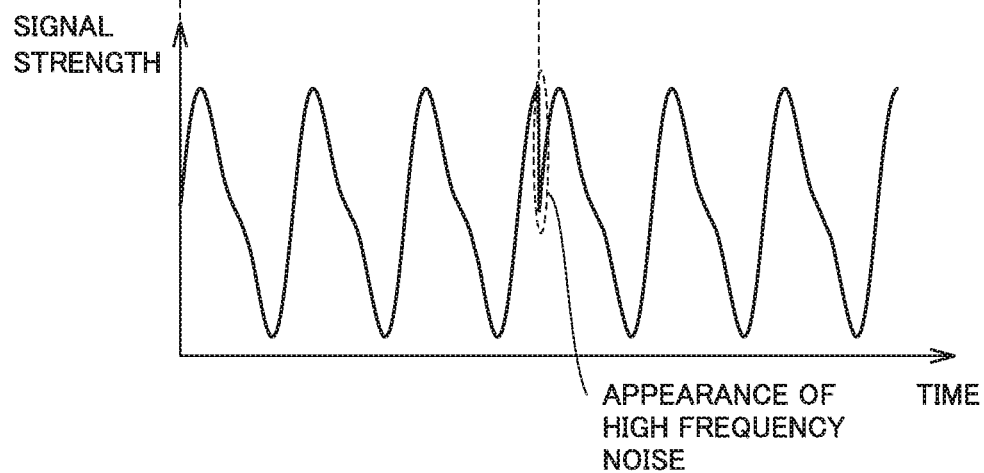
FIG. 10B is a diagram (the second diagram) showing an example of the signal to be subjected to Fourier transform.

FIG. 10(A) shows the actual shape of a signal waveform. The following is a situation assumed that a relatively short data acquisition time period is set for such the signal waveform. Under the assumption that the signal is periodic, as shown in FIG. 10(B), Fourier transform is performed based on the premise that the signal waveform is connected between the trailing end of a certain data acquisition time period and the leading end of the next data acquisition time period. Thus, an analysis may be conducted assuming that the signal abruptly changes in the connection portion between the data acquisition time periods. Consequently, the analysis result of Fourier transform may contain a high frequency component.

In the present embodiment, frequency range F1 falls, for example, in a range of several dozen mHz to several hundred mHz (by way of example, 30 mHz to 200 mHz). In this case, the period of the current component in frequency range F1 is the order of about several seconds to about several ten seconds. In such a case, by way of example, assuming that the sampling period is set at 0.1 second to perform 256 times of sampling, the length of the data acquisition time period is set at 25.6 seconds. In other words, the period of the current component in frequency range F1 and the length of the data acquisition time period are almost the same.

In this way, when the period of the current component is almost the same as or relatively longer than the length of the data acquisition time period, there occurs a significant deviation from the assumption that the current component is periodic. Thus, particularly when the current component in frequency range F is significantly greater than the current component in each of frequency ranges F2 and F3, there occurs a significant influence of the sudden change of the signal at the end of the data acquisition time period as described above (the connection portion between the data acquisition time periods). As a result, the current variations in frequency ranges F2 and F3 are more likely to increase due to the influence of the high frequency component included in the analysis result of Fourier transform.

In this way, when both the first and second current conditions are satisfied to decrease the accuracy of Fourier transform of the current value, highly accurate calculation of the impedance component of battery 10 cannot be done. More specifically, when the current variations in frequency ranges F2 and F3 are large, the impedance component calculated from the ratio of the voltage component and the current component after FFT (=voltage component/current component) also may show an abnormal value. By way of example, when an excessively small current component is detected due to the influence of the current variation, an excessively high impedance component is to be calculated. As the result, the accuracy in estimating the deterioration state of battery 10 may be decreased.

Thus, the first embodiment employs the configuration in which the current component in the case where the first and second current conditions are satisfied (see FIG. 8) is not used for calculating the impedance component. In other words, the impedance component is calculated based on the current component after FFT in the case where at least one of the first and second current conditions is not satisfied (see FIG. 9). Thereby, the accuracy in calculating the impedance component of battery 10 is improved. Consequently, the accuracy in estimating the deterioration state of battery 10 can be improved.

<Determination Flow of Battery Deterioration State>

Figure 11:
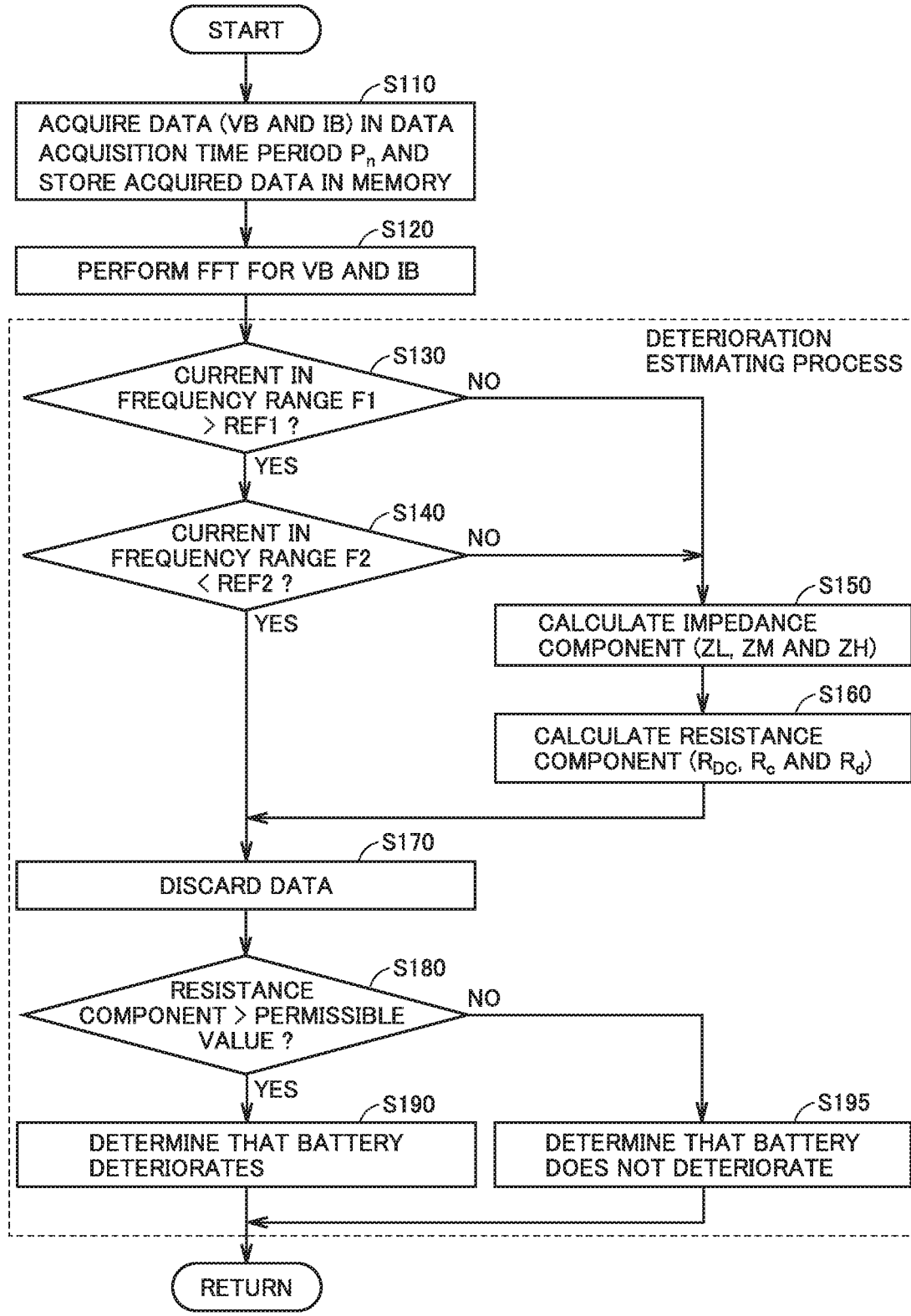
FIG. 11 is a flowchart illustrating a method of determining the deterioration state of a battery in the first embodiment.

FIG. 11 is a flowchart illustrating a method of determining the deterioration state of battery 10 in the first embodiment. The process in each of flowcharts shown in FIG. 11 and FIG. 14 (described later) is performed as it is called from a main routine each time a predetermined period elapses during traveling of vehicle 1. Each step (which will be hereinafter abbreviated as S) is basically implemented by software processing performed by ECU 100, but may be implemented by hardware processing performed by an electronic circuit fabricated in ECU 100.

Referring to FIG. 11, in a certain data acquisition time period $P_n$ (n is a natural number), ECU 100 acquires voltage VB and current IB from each sensor in monitoring unit 20 of battery 10 in a predetermined sampling period (S110). Every data acquired by ECU 100 (the result of acquiring voltage VB and current IB) is temporarily stored in memory 102. It is to be noted that the length of data acquisition time period $P_n$ can be set, for example, at about several seconds to about several ten seconds. The sampling period can be set, for example, in the order of millisecond to the order of several hundred milliseconds.

In S120, ECU 100 performs FFT for the data (voltage VB and current IB) accumulated in memory 102. Then, ECU 100 determines whether the first and second current conditions are satisfied or not for the current component after FFT. Specifically, ECU 100 determines whether the current component after FFT in frequency range F1 is greater than reference value REF1 or not (the first current condition). Also, ECU 100 determines whether the current component after FFT in frequency range F2 is less than reference value REF2 or not (the second current condition).

When the current component after FFT in frequency range F1 is equal to or less than reference value REF1 (NO in S130) or when the current component after FFT in frequency range F2 is equal to or greater than reference value REF2 (NO in S140), that is, when at least one of the first and second current conditions is not satisfied, the current variations in frequency ranges F2 and F3 are relatively small, as having been described with reference to FIG. 9. Thus, ECU 100 calculates the impedance component for each frequency based on the voltage component and the current component after FFT (S150). The impedance component in each frequency range can be calculated based on the ratio of voltage VB and current IB (VB/IB) in the frequency range (regarding a specific calculation formula for the impedance component, for example, see Japanese Patent Laying-Open No. 2005-221487).

In S160, ECU 100 calculates DC resistance $R_{DC}$, reaction resistance $R_c$ and diffusion resistance $R_d$ of battery 10 based on the impedance component for each frequency range. Since such the calculation method has been described in detail with reference to FIG. 5, the detailed description thereof will not be repeated. Then, ECU 100 discards the data (the result of acquiring voltage VB and current IB) accumulated in memory 102 (S170).

On the other hand, in S130 and S140, when the current component after FFT in frequency range F1 is greater than reference value REF1 (YES in S130) and when the current component after FFT in frequency range F2 is less than reference value REF2 (YES in S140), that is, when both the first and second current conditions are satisfied, ECU 100 advances the process to S170 without performing the process of calculating the impedance component and the resistance component (S150, S160), and then, discards the data accumulated in memory 102.

In S180, ECU 100 estimates the deterioration state of battery 10 based on each resistance component (DC resistance $R_{DC}$, reaction resistance $R_c$ and diffusion resistance $R_d$) calculated in S160. Specifically, ECU 100 compares DC resistance $R_{DC}$ with a permissible value XH, compares reaction resistance $R_c$ with a permissible value XM, and compares diffusion resistance $R_d$ with a permissible value XL. Then, when at least one of the resistance components is higher than the corresponding permissible value (YES in S180), ECU 100 determines that deterioration of battery 10 progresses (S190). On the other hand, when all of the resistance components are equal to or less than the corresponding permissible values (NO in S180), ECU 100 determines that deterioration of battery 10 does not progress (S195).

It is to be noted that the process of estimating the deterioration state of battery 10 (the processes in S180 to S195) may be performed in a separate flow. In other words, the process in the flowchart in FIG. 11 may be repeatedly performed until the result of calculating the resistance component in S150 and S160 is accumulated to some extent. Then, after the result of calculating the resistance component is accumulated, the deterioration state of battery 10 may be estimated.

A series of processes shown in the flowchart in FIG. 11 is performed in each prescribed sampling period. Thereby, the similar process will be repeatedly performed also in data acquisition time periods $P_{n+1}$, $P_{n+2}$, . . . subsequent to the present data acquisition time period $P_n$.

When it is determined in S190 that deterioration of battery 10 progresses, ECU 100 can suppress charging and discharging of battery 10. Specifically, ECU 100 sets the restricted upper limit value (the charge power control upper limit value and the discharge power control upper limit value) of charge power and discharge power for battery 10 at a low value. Thereby, further progress of deterioration of battery 10 can be suppressed, or the deterioration speed of battery 10 can be reduced. Furthermore, ECU 100 may perform control to immediately stop charging and discharging of battery 10. For example, ECU 100 shifts vehicle 1 into a fail safe mode and notifies the user of vehicle 1 to bring vehicle 1 to a motor vehicle dealer (or a repair shop and the like) such that vehicle 1 can be appropriately checked.

FIG. 12 is a diagram for comparing the results of calculating the resistance component between the comparative example and the first embodiment. In FIG. 12, the horizontal axis shows an elapsed time period while the vertical axis shows reaction resistance $R_c$ of battery 10.

Figure 12A:
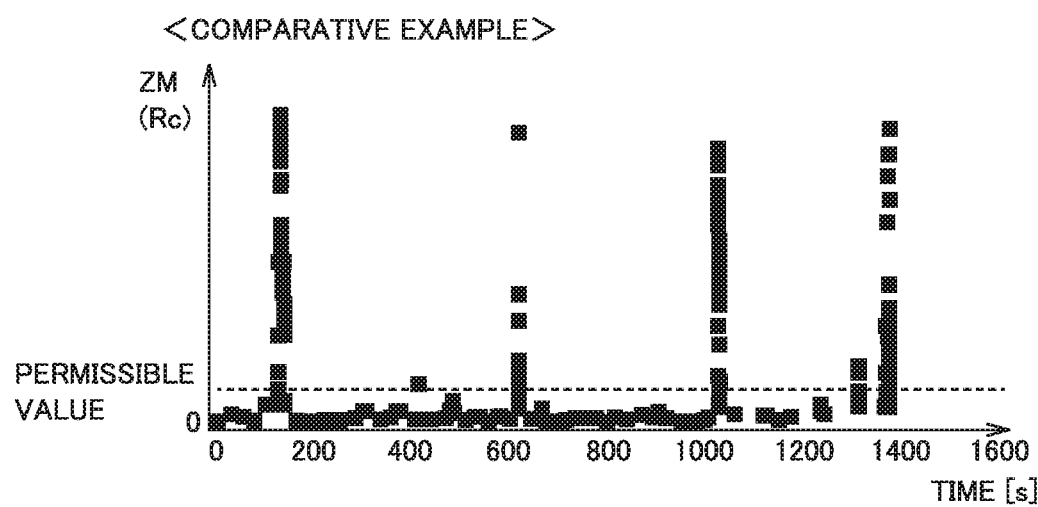
FIG. 12A is a diagram (the first diagram) for comparing the results of calculating the resistance component between a comparative example and the first embodiment.
Figure 12B:
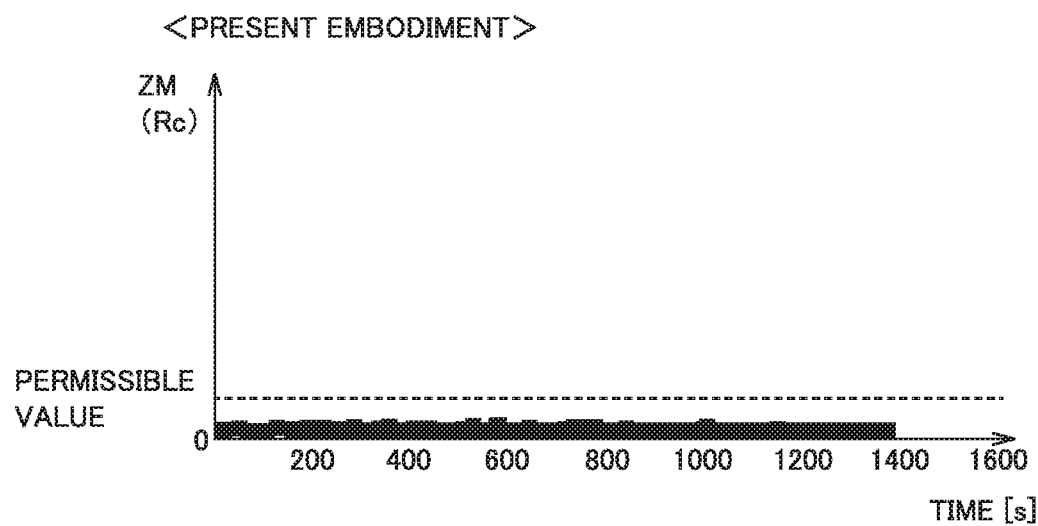
FIG. 12B is a diagram (the second diagram) for comparing the results of calculating the resistance component between the comparative example and the first embodiment.

FIG. 12(A) shows the result of calculating reaction resistance $R_c$ in the comparative example, that is, reaction resistance $R_c$ calculated based on every data without considering the first and second current conditions. On the other hand, FIG. 12(B) shows reaction resistance $R_c$ calculated based on the data acquired when at least one of the first and second current conditions is not satisfied while the data acquired when the first and second current condition are satisfied is not used but discarded, as having been described with reference to FIG. 11.

Battery 10 used in this comparison does not deteriorate, and reaction resistance $R_c$ of battery 10 is actually lower than permissible value XM. However, in the comparative example shown in FIG. 12(A), reaction resistance $R_c$ may be erroneously calculated as being greater than permissible value XM. On the other hand, in the present embodiment, as shown in FIG. 12(B), all of the calculation results show that reaction resistance $R_c$ is lower than permissible value XM. Thus, it turns out that an erroneous calculation as in the comparative example does not occur.

As described above, in the first embodiment, the data (VB, IB) acquired when the first and second current conditions are satisfied is not used for calculating the impedance component for each frequency range, but the data acquired when at least one of the first and second current conditions is not satisfied is used to calculate the impedance component for each frequency range. When the first and second current conditions are satisfied and when the current component in frequency range F1 is dominant, the current variations in frequency ranges F2 and F3 higher than frequency range F1 are more likely to increase. Accordingly, by refraining from using such data for calculation of the impedance component, the accuracy in estimating the deterioration state of battery 10 can be improved.

In the first embodiment, an explanation has been given with regard to the configuration in which the impedance component of battery 10 is calculated using an irregular current waveform (and a voltage waveform) generated during traveling of vehicle 1 that is a hybrid vehicle. Although not shown, when vehicle 1 is a plug-in hybrid vehicle or an electric vehicle, that is, when vehicle 1 has a configuration in which battery 10 can be charged with electric power supplied from a power supply (an external power supply) provided external to the vehicle (so-called externally chargeable configuration), the impedance component may be calculated based on the waveform of the current supplied from the external power supply during external charging. Instead of supplying electric power having a constant current waveform from the external power supply, by applying a current waveform (a sine wave, a rectangular wave or a triangular wave) in which the frequency range extends across a low frequency range to a high frequency range, the impedance component in each frequency range can be calculated.

Second Embodiment

The impedance (impedance component in each frequency range) of battery 10 may have current dependency, temperature dependency and SOC dependency. Accordingly, when one of current IB, temperature TB and the SOC of battery 10 excessively changes during a certain data acquisition time period, Fourier transforms (FFT) are collectively performed even though the influence of dependency (the current dependency, the temperature dependency or the SOC dependency) is different between a certain time period (the time period before change) and another time period (the time period after change) in this certain data acquisition time period. Accordingly, highly accurate calculation of the impedance may not be able to be done.

In view of the above-described circumstances, in the second embodiment, the data for which FFT is performed is subjected to the condition that each of current IB, temperature TB and the SOC of battery 10 does not significantly change during the data acquisition time period. Based on a current variation width ΔIB, a temperature variation width ΔTB and an SOC variation width ΔSOC, it is determined whether this condition is satisfied or not.

Figure 13:
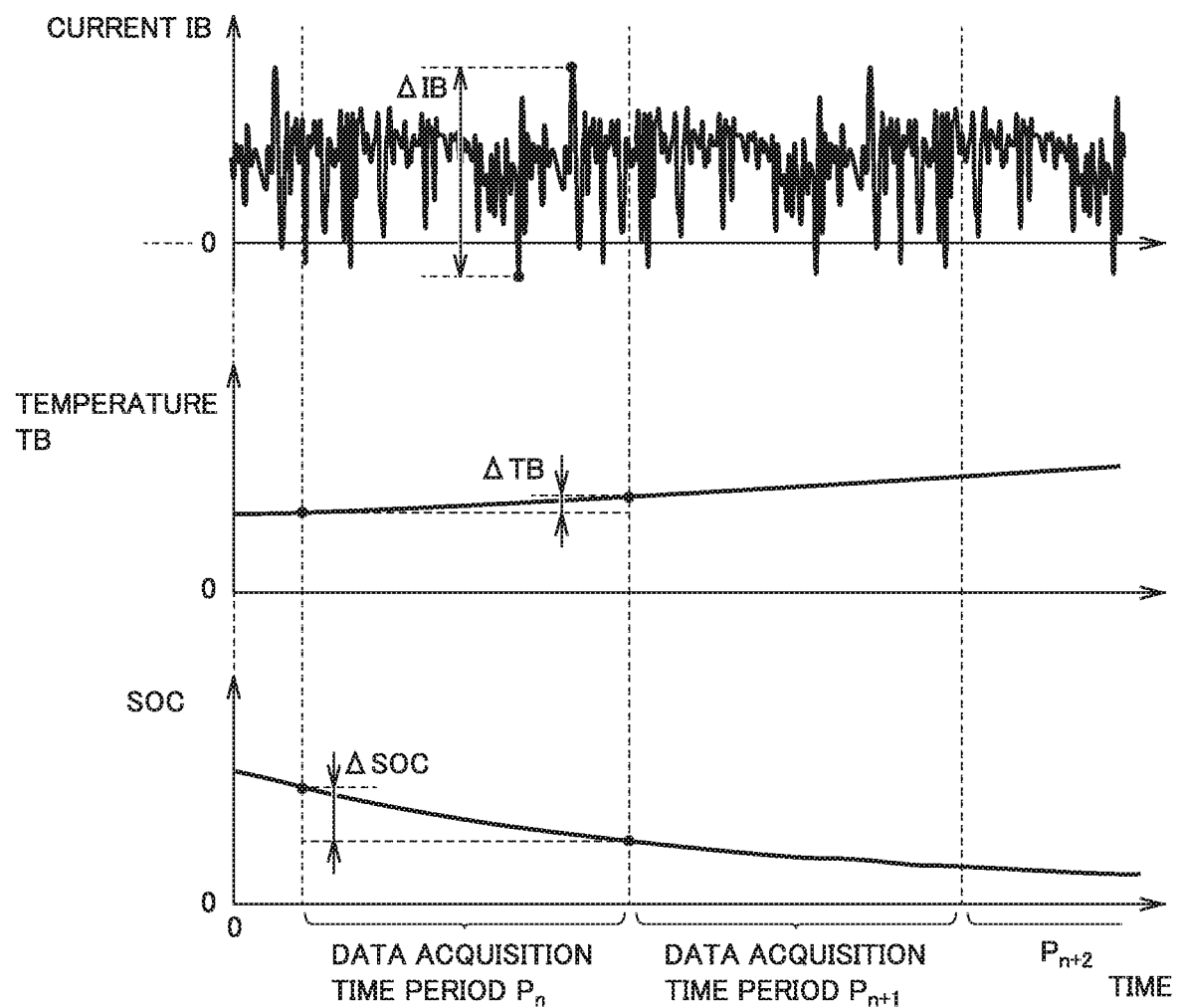
FIG. 13 is a diagram showing an example of a temporal change in data in a data acquisition time period.

FIG. 13 is a diagram showing an example of a temporal change in data in a data acquisition time period. Referring to FIG. 13, in consideration of both the charging direction and the discharging direction of battery 10 in data acquisition time period $P_n$, current variation width MB can be calculated from the variation width of current IB (the difference between the highest current in the charging direction and the highest current in the discharging direction). Temperature variation width ΔTB can be calculated from the difference between the highest temperature (the highest value of temperature TB) and the lowest temperature (the lowest value of temperature TB) in data acquisition time period $P_n$. SOC variation width ΔSOC can be calculated from the difference between the maximum SOC and the minimum SOC in data acquisition time period $P_n$.

Figure 14:
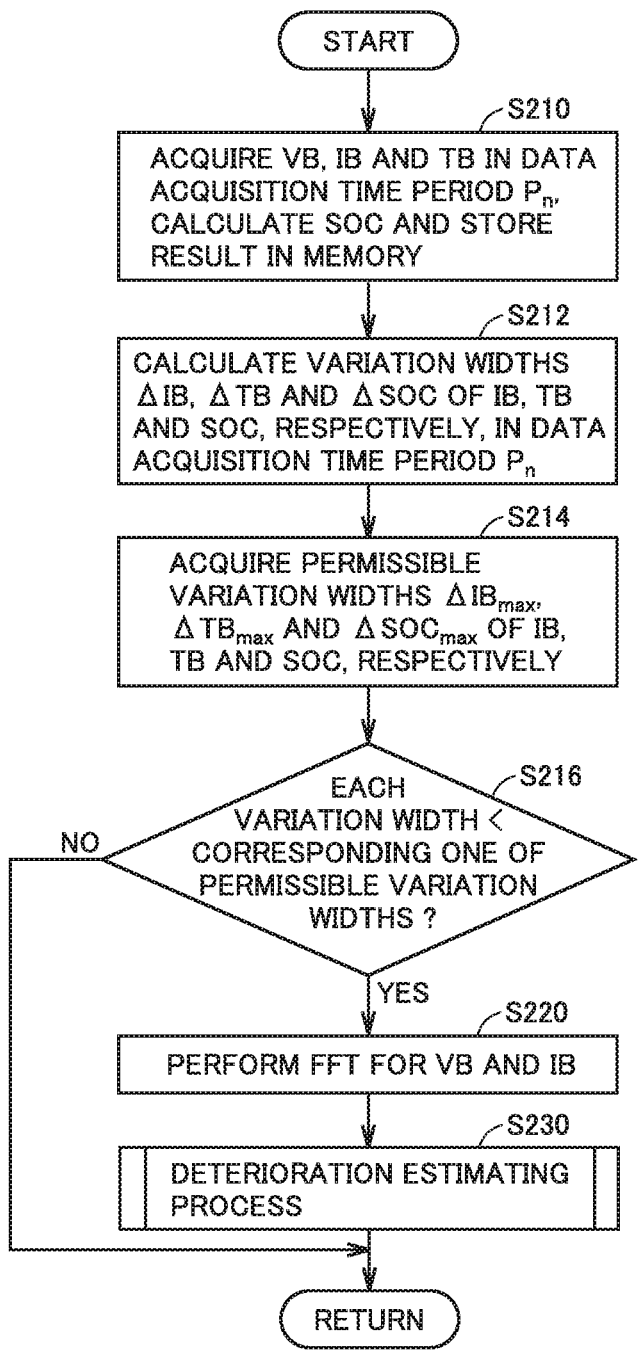
FIG. 14 is a flowchart illustrating a method of determining a deterioration state of a battery in the second embodiment.

FIG. 14 is a flowchart illustrating a method of determining a deterioration state of battery 10 in the second embodiment. Referring to FIG. 14, in S210, in a certain data acquisition time period $P_n$, ECU 100 acquires voltage VB, current IB and temperature TB from each sensor in monitoring unit 20 of battery 10 in a predetermined sampling period. Furthermore, ECU 100 estimates the SOC of battery 10 in a prescribed time period. Then, ECU 100 temporarily stores every data (the result of acquiring voltage VB, current IB and temperature TB and the result of calculating the SOC) in memory 102.

In S212, ECU 100 calculates current variation width ΔIB which is the variation width of current IB in data acquisition time period $P_n$. Furthermore, ECU 100 calculates temperature variation width ΔTB which is the variation width of temperature TB in data acquisition time period $P_n$. Furthermore, ECU 100 calculates SOC variation width ΔSOC which is the variation width of the SOC of battery 10 in data acquisition time period $P_n$.

In S214, ECU 100 acquires a permissible current variation width $\Delta IB_{max}$ by referring to map MP stored in advance in memory 102 in a non-volatile manner. Permissible current variation width $\Delta IB_{max}$ is a parameter based on which it is determined whether or not to use the data accumulated in memory 102 in S210 for calculating the impedance, and shows the permissible upper limit of current variation width ΔIB. Furthermore, also for temperature variation width ΔTB and SOC variation width ΔSOC, ECU 100 similarly acquires a permissible temperature variation width $\Delta TB_{max}$ and a permissible SOC variation width $\Delta SOC_{max}$, respectively, by referring to map MP.

FIG. 15 is a diagram showing an example of map MP. As shown in FIG. 15, in map MP, for each range of an average temperature $TB_{ave}$ of battery 10 in data acquisition time period $P_n$, permissible current variation width $\Delta IB_{max}$, permissible temperature variation width $\Delta TB_{max}$, and permissible SOC variation width $\Delta SOC_{max}$ in data acquisition time period $P_n$ are defined.

In place of average temperature $TB_{ave}$, for example, the highest temperature or the lowest temperature may be used or the most frequent value of temperature TB may be used. Furthermore, in place of temperature TB (average temperature $TB_{ave}$, the highest temperature, the lowest temperature, or the most frequent temperature), current IB (for example, the average current, the highest current or the lowest current) or the SOC (for example, the average SOC, the maximum SOC or the minimum SOC) may be used.

Although an explanation will be given with regard to an example in which map MP is used in this case, for example, functions or equations may be used in place of a map. It is also to be noted that specific numerical values shown in FIG. 15 are presented merely by way of example for allowing easy understanding of map MP.

Referring back to FIG. 14, in S216, ECU 100 determines whether current variation width ΔIB is less than permissible current variation width $\Delta IB_{max}$ or not. Furthermore, ECU 100 also determines whether temperature variation width ΔTB is less than permissible temperature variation width $\Delta TB_{max}$ or not, and determines whether SOC variation width ΔSOC is less than permissible SOC variation width $\Delta SOC_{max}$ or not.

When current variation width ΔIB, temperature variation width ΔTB and SOC variation width ΔSOC are less than their respective permissible variation widths, that is, when the current condition of $\Delta IB<\Delta IB_{max}$ is satisfied, when the temperature condition of $\Delta TB<\Delta TB_{max}$ is satisfied, and when the SOC condition of $\Delta SOC<\Delta SOC_{max}$ is satisfied (YES in S216), ECU 100 performs FFT for the data (voltage VB and current IB) accumulated in memory 102 in S102 (S220). Since the processes after S230 are the same as the corresponding processes (the deterioration estimating process surrounded by a dashed line) in the first embodiment, the detailed description thereof will not be repeated.

As described above, according to the second embodiment, in view of the fact that the impedance of battery 10 has current dependency, temperature dependency and SOC dependency, the impedance is calculated when each of current IB, temperature TB and the SOC of battery 10 does not significantly change during the data acquisition time period. In other words, when at least one of current IB, temperature TB and the SOC of battery 10 significantly changes beyond its corresponding permissible variation width (one of $\Delta IB_{max}$, $\Delta TB_{max}$ and $\Delta SOC_{max}$) in the data acquisition time period, the data (voltage VB and current IB) acquired during this data acquisition time period is not subjected to FFT, and not used for calculation of the impedance. Thereby, the current dependency, the temperature dependency and the SOC dependency can be appropriately reflected in the result of calculating the impedance of battery 10, so that the accuracy in estimating the deterioration state of battery 10 can be improved.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A method of estimating a deterioration state of a secondary battery, the method being performed by a controller for a secondary battery mounted in a vehicle, the method comprising:

acquiring a voltage value and a current value of the secondary battery a plurality of times in a prescribed time period, and storing a plurality of voltage values and a plurality of current values in a memory;

performing frequency conversion for each of the plurality of voltage values and each of the plurality of current values that are stored in the memory to calculate a voltage value and a current value of the secondary battery for each frequency in a plurality of frequency ranges;

determining whether or not a first condition and a second condition are satisfied for the current value of the secondary battery that is calculated for each frequency in the plurality of frequency ranges;

calculating an impedance component of the secondary battery for each of the plurality of frequency ranges based on the voltage value and the current value, which are subjected to frequency conversion, when at least one of the first condition and the second condition is not satisfied, and not calculating the impedance component of the secondary battery for each of the plurality of frequency ranges when each of the first condition and the second condition is satisfied; and estimating a deterioration state of the secondary battery in a deterioration mode according to each of the plurality of frequency ranges by using the impedance component calculated for each of the plurality of frequency ranges, the first condition being a condition that a current value of the secondary battery in a first frequency range is greater than a first reference value, the second condition being a condition that a current value of the secondary battery in a second frequency range higher than the first frequency range is less than a second reference value, the second reference value being less than the first reference value.

2. The method of estimating a deterioration state of a secondary battery according to claim 1, further comprising:

calculating a current variation width of the secondary battery, a temperature variation width of the secondary battery, and an SOC variation width of the secondary battery in the prescribed time period; and acquiring, based on one of a temperature, a current and an SOC of the secondary battery, a permissible current variation width showing a permissible upper limit of the current variation width, a permissible temperature variation width showing a permissible upper limit of the temperature variation width, and a permissible SOC variation width showing a permissible upper limit of the SOC variation width, the permissible current variation width, the permissible temperature variation width and the permissible SOC variation width being set for one of the temperature, the current and the SOC of the secondary battery in the prescribed time period, wherein the calculating an impedance component of the secondary battery for each of the plurality of frequency ranges is performed upon satisfaction of each of: (i) a current condition that the current variation width is less than the permissible current variation width; (ii) a temperature condition that the temperature variation width is less than the permissible temperature variation width; and (iii) an SOC condition that the SOC variation width is less than the permissible SOC variation width.

3. A secondary battery system configured to be mounted in a vehicle, the secondary battery system comprising:

a secondary battery; and a controller including a memory and configured to estimate a deterioration state of the secondary battery, the controller being configured to acquire a voltage value and a current value of the secondary battery a plurality of times in a prescribed time period, and store a plurality of voltage values and a plurality of current values in the memory, perform frequency conversion for each of the plurality of voltage values and each of the plurality of current values that are stored in the memory to calculate a voltage value and a current value of the secondary battery for each frequency in a plurality of frequency ranges, determine whether or not a first condition and a second condition are satisfied for the current value of the secondary battery that is calculated for each frequency in the plurality of frequency ranges, calculate an impedance component of the secondary battery for each of the plurality of frequency ranges based on the voltage value and the current value, which are subjected to frequency conversion, when at least one of the first condition and the second condition is not satisfied, and not calculate the impedance component of the secondary battery for each of the plurality of frequency ranges when each of the first condition and the second condition is satisfied, and estimate a deterioration state of the secondary battery in a deterioration mode according to each of the plurality of frequency ranges by using the impedance component calculated for each of the plurality of frequency ranges, the first condition being a condition that a current value of the secondary battery in a first frequency range is greater than a first reference value, the second condition being a condition that a current value of the secondary battery in a second frequency range higher than the first frequency range is less than a second reference value, the second reference value being less than the first reference value.

* * * * *